US 6,597,440 B1

(12) United States Patent
Sasaki

(10) Patent No.: US 6,597,440 B1
(45) Date of Patent: Jul. 22, 2003

(54) WAVEFRONT MEASURING METHOD AND PROJECTION EXPOSURE APPARATUS

(75) Inventor: Ryo Sasaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/542,341

(22) Filed: Apr. 5, 2000

(30) Foreign Application Priority Data

Apr. 6, 1999  (JP) .............................................. 11-098770

(51) Int. Cl.[7] .................................................. G01J 1/00
(52) U.S. Cl. ........................................ 356/121; 356/123
(58) Field of Search ................. 355/53, 55; 356/121–3, 356/250

(56) References Cited

U.S. PATENT DOCUMENTS 4,943,733 A * 7/1990 Mori et al. ................... 250/548

OTHER PUBLICATIONS

Rudolf M. von Bunau, et al., "Phase Retrieval from Defocused Images and Its Applications in Lithography", *Jpn. J. Appl. Phys.*, vol. 36(1997), Part 1, No. 12B, Dec. 1997, pp. 7494–7498.

* cited by examiner

Primary Examiner—Georgia Epps
Assistant Examiner—Mohammad Abutayeh
(74) Attorney, Agent, or Firm—Fitzpatrick, Cella, Harper & Scinto

(57) ABSTRACT

A method of measuring a wavefront aberration of a predetermined optical system being serviceable for imaging a pattern. The method includes storing information related to a light intensity distribution on a pupil plane of the predetermined optical system in a reference state, and detecting a wavefront of the predetermined optical system in an arbitrary state, on the basis of the stored information.

11 Claims, 5 Drawing Sheets

WAVEFRONT MEASURING METHOD AND PROJECTION EXPOSURE APPARATUS

FIELD OF THE INVENTION AND RELATED ART

This invention relates to a wavefront measuring method in a projection exposure apparatus usable in a lithographic process, for the manufacture of semiconductor devices, for transferring a pattern of a mask onto a photosensitive substrate through a projection optical system. In another aspect, the invention is concerned with a projection exposure apparatus which uses such a method.

A photolithographic process for the manufacture of semiconductor devices, for example, uses a projection type exposure apparatus for transferring a circuit pattern, formed on a reticle or photomask (hereinafter "reticle"), onto a semiconductor wafer, for example, being coated with a photosensitive material. In such an exposure apparatus, it is required that a pattern of a reticle is accurately transferred onto a wafer with a predetermined magnification (reduction ratio). It is, therefore, important to use a projection lens having a good imaging performance and reduced aberration. Particularly, in recent years, further miniaturization of a semiconductor device has been required more and more. Therefore, in many cases, a pattern corresponding to the limit imaging performance for a pattern transfer through a projection lens, has to be transferred. As a result, a pattern to be transferred becomes more sensitive to aberration of an optical system. In these situations, it is desired to measure and control the imaging performance of a projection lens. Many proposals have been made in regard to the measurement and control.

An example of measuring the imaging performance of a projection lens is a phase restoration method. The phase restriction method is used mainly to improve the resolution of an optical system such as an astronomical telescope, having a large aberration, or an electron microscope. In accordance with this method, a phase distribution of an image is detected on the basis of image intensity distributions at plural points such as a focal plane (surface), a pupil plane, a defocused position and the like, and then a wavefront aberration of the optical system is calculated from the detected phase distribution.

FIG. 1A shows an algorithm of an ordinary phase restoration method. First, an arbitrary phase is assigned to a measured intensity distribution at a focal plane and, then, through Fourier transform, a complex amplitude distribution upon a pupil plane is detected. Subsequently, while holding a phase portion of the thus detected complex amplitude distribution unchanged, only an absolute value corresponding to an intensity portion thereof is replaced by a value (the square root of the intensity on the pupil plane) corresponding to an actually measured value, by which a fresh complex amplitude distribution is determined. Then, by performing inverse Fourier transform to the thus determined complex amplitude distribution, a complex amplitude distribution on the focal plane is detected. Then, while holding again its phase portion as it is, the intensity is replaced by an actually measured value.

The above-described calculations are repeated until convergence, whereby complex amplitude distributions on the focal plane and the pupil plane are detected. From the phase distribution in the complex amplitude distribution upon the pupil plane, the wavefront aberration of a lens can be calculated.

In a case wherein measurement of an intensity distribution upon a pupil plane is difficult to accomplish, as in the case of photolithography, another method as reported in J.J.A.P. Vol. 36, 1997, pages 7494–7498 may be used. In accordance with this method, as shown in FIG. 1B, between a focal plane and a defocused plane, across a pupil plane, transform and inverse transform are repeated, by which a complex amplitude distribution on the focal plane and a complex amplitude distribution on the defocused plane are calculated. Then, from the results of the calculation, the phase distribution on the pupil plane, that is, the wavefront aberration of a projection optical system is detected.

Generally, in a projection exposure apparatus, direct measurement of an intensity distribution upon a pupil plane is difficult to accomplish. For this reason, in order to detect a wavefront aberration of a projection optical system (projection lens) corresponding to a phase distribution on a pupil plane thereof on the basis of the phase restoration method, it is necessary to measure light intensity distributions upon a focal plane and a defocused plane.

In the measurement of a light intensity distribution, not only the measurement time for measuring light intensity distributions on the focal plane and the defocused plane but also the movement time of a light intensity distribution measuring system as well as the calculation time for calculation of a wavefront aberration of a projection optical system, are all important factors. If any of these two time periods is long, it is difficult to accurately measure the aberration of the projection optical system which is variable slightly during an exposure process due to absorption of exposure light by the projection optical system.

SUMMARY OF THE INVENTION

It is an object of the present invention to provide a projection exposure apparatus having a function for measuring a wavefront aberration quickly and precisely, by which not only a dynamic state but also a dynamic imaging performance of a projection optical system, which is variable slightly due to an exposure process, can be detected in an arbitrary time period.

In accordance with an aspect of the present invention, there is provided a projection exposure apparatus or a wavefront aberration measuring method for a projection exposure apparatus, wherein a light intensity distribution upon a pupil plane, in a reference state of exposure, is detected beforehand. In one preferred form of this aspect of the present invention, a wavefront aberration of a projection exposure lens in an arbitrary state during an exposure process can be detected in accordance with a phase restoration method, while referring to a measured value of an image plane light intensity distribution in an arbitrary state as well as a pupil plane intensity distribution in the reference state. Here, the term "arbitrary state" means the state at an arbitrary moment where the optical characteristic of the projection optical system at the reference state is changed due to an exposure load or an environmental change (e.g., temperature, pressure or humidity).

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
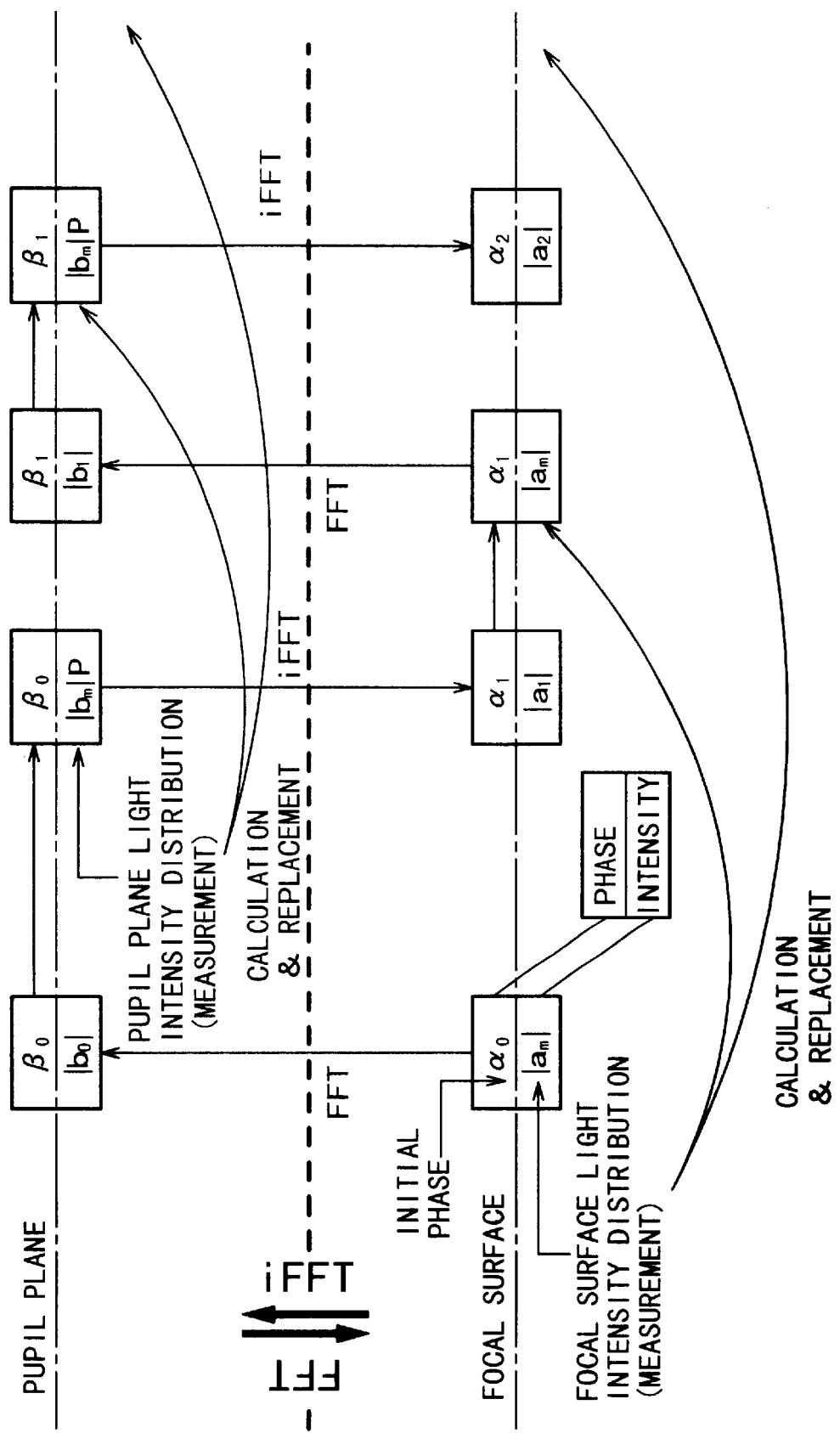
FIG. 1A is a schematic view for explaining the principle of a phase restoration method.
Figure 1B:
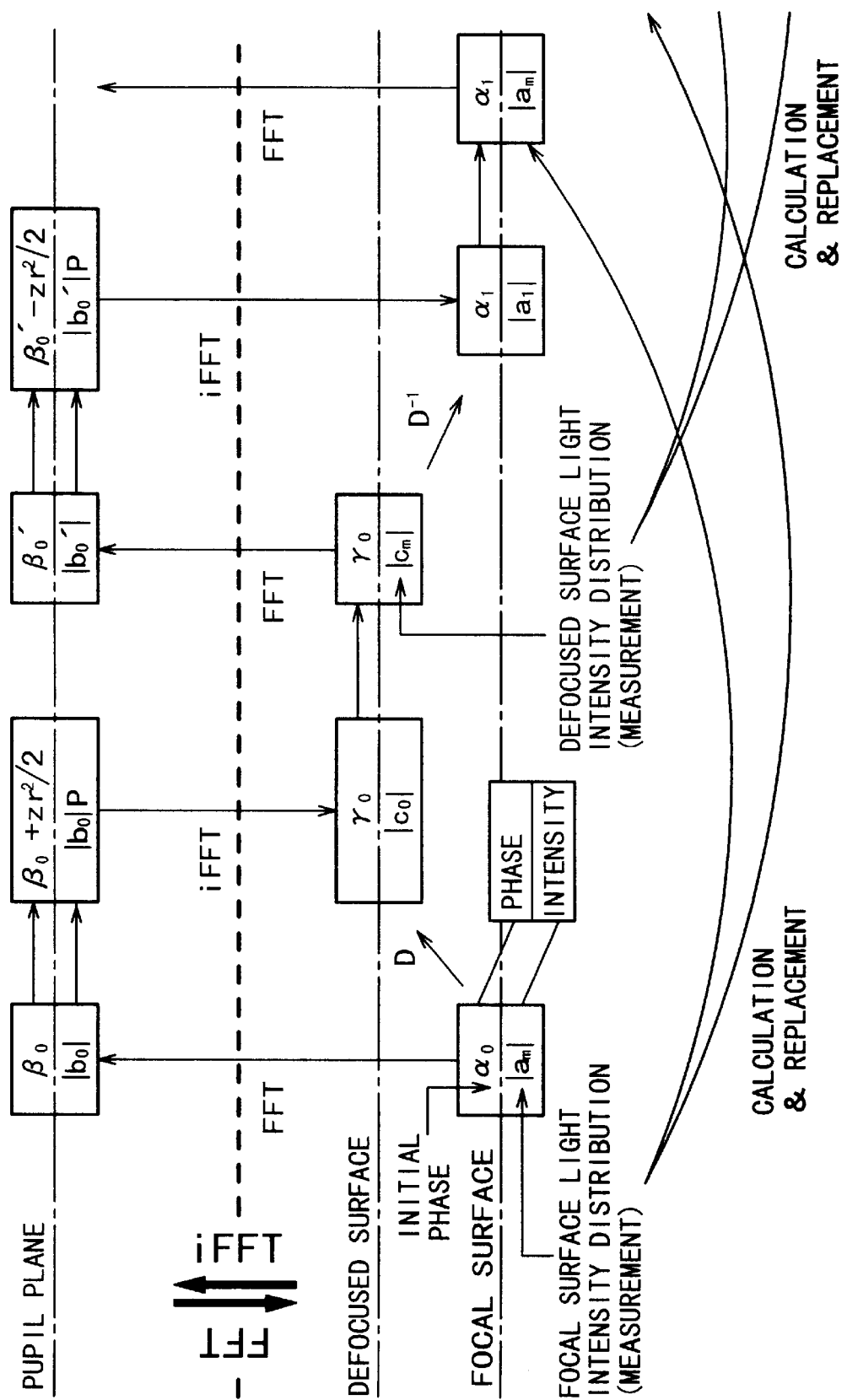
FIG. 1B is a schematic view for explaining the principle of a phase restoration method as that method is applied to a projection exposure apparatus.
Figure 2A:
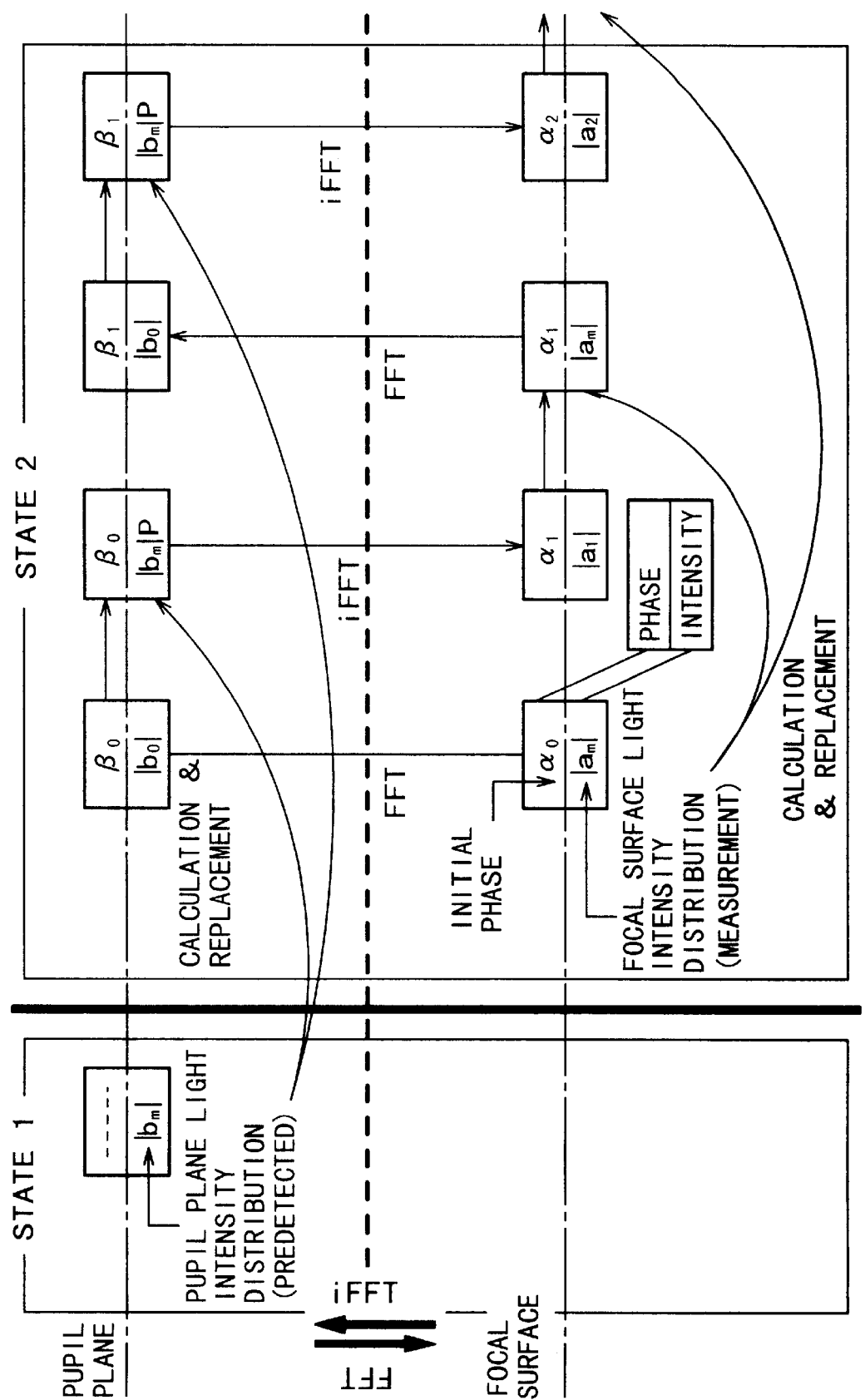
FIG. 2A is a schematic view for explaining the principle of a phase restoration method in an embodiment of the present invention.
Figure 2B:
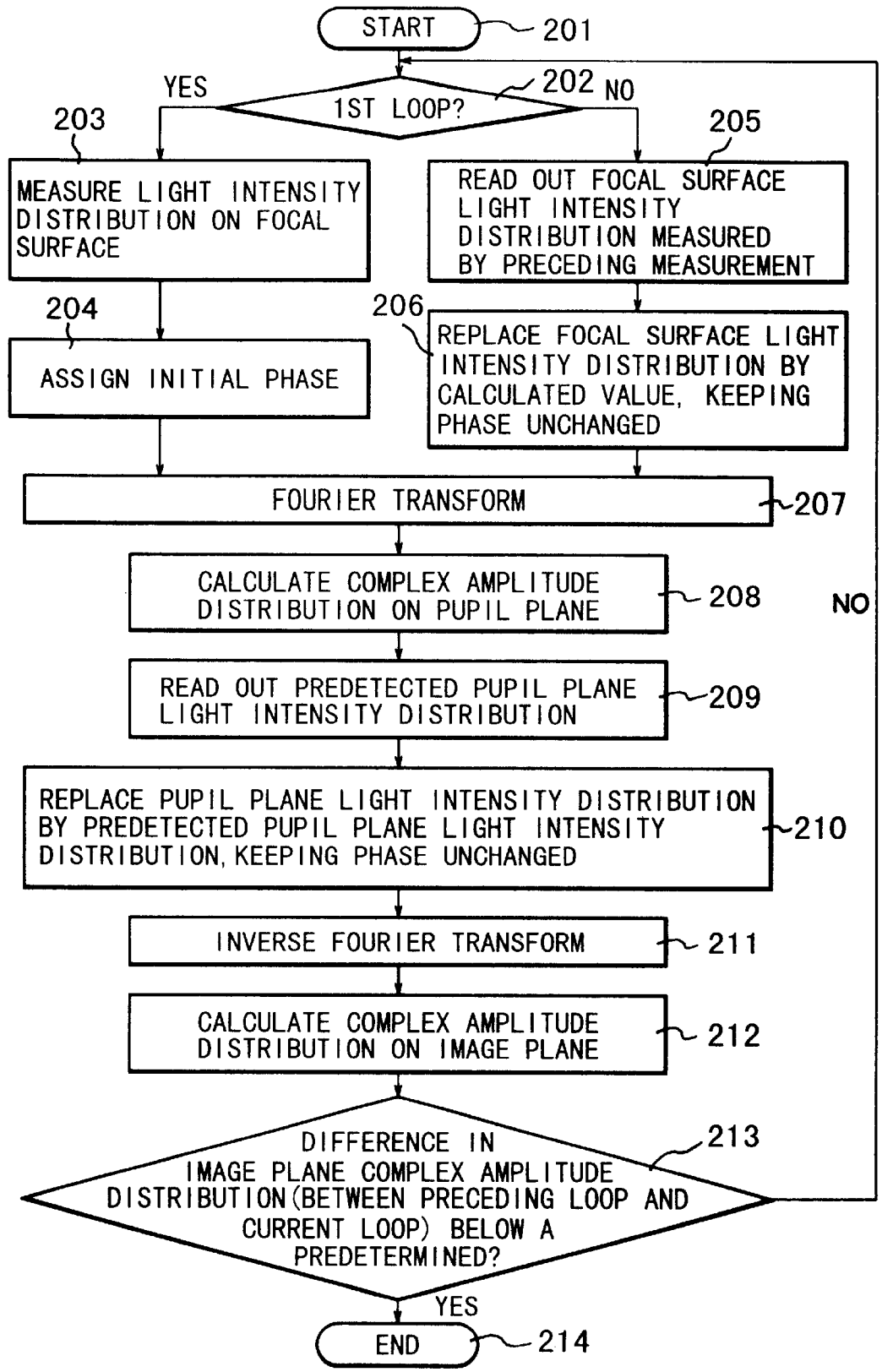
FIG. 2B is a flow chart for explaining a procedure according to a phase restoration method, in an embodiment of the present invention.
Figure 3:
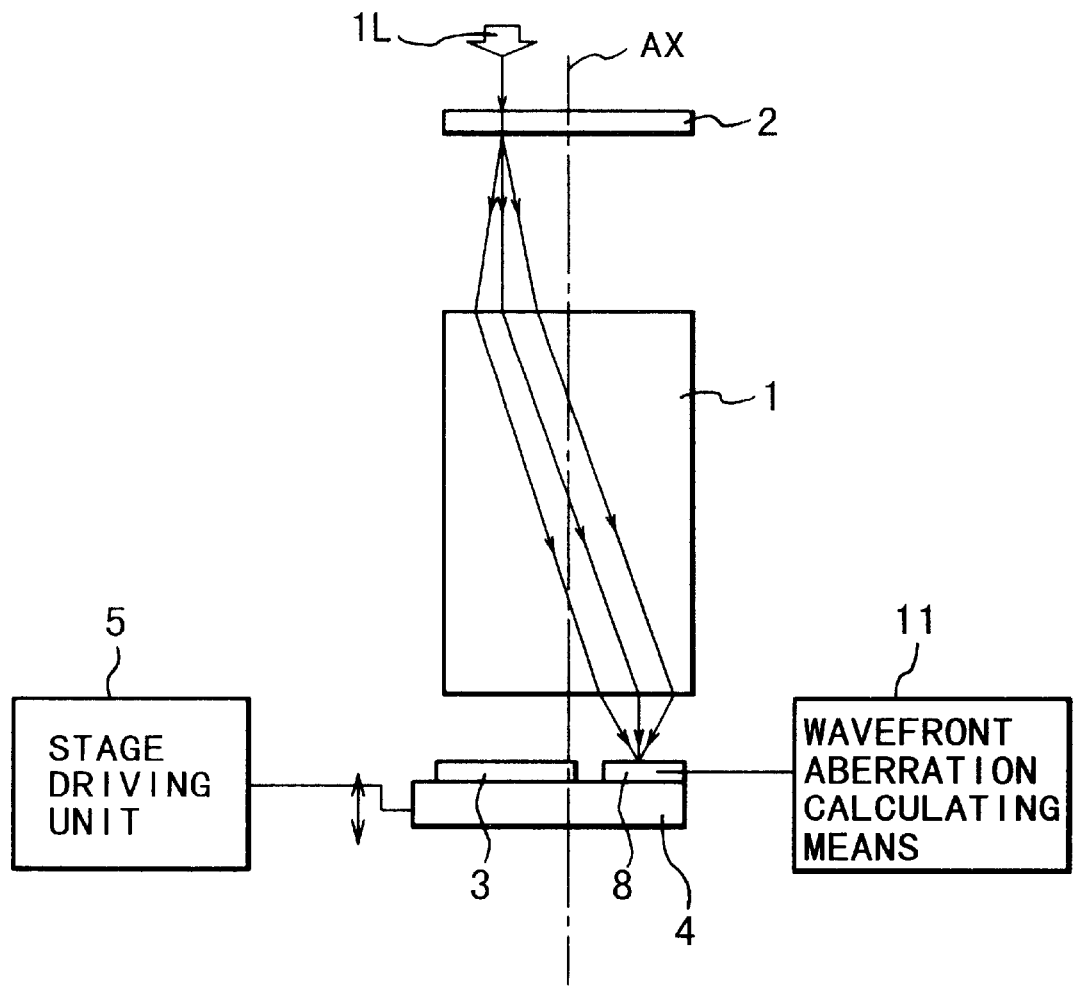
FIG. 3 is a schematic view for explaining a projection exposure apparatus according to an embodiment of the present invention, to which a phase restoration method is applied.

Referring to FIGS. 2A, 2B and 3, preferred embodiments of the present invention will be described.

FIG. 3 is a schematic view of a projection exposure apparatus according to a first embodiment of the present invention. Denoted in the drawing at 2 is an original reticle (photomask) having a circuit pattern formed thereon. The circuit pattern of the reticle 2 is imaged, in a reduced scale, by a projection optical system (reduction projection lens) 1 upon a wafer 3 which is held by an X-Y-Z stage (holding means) 4, whereby the latter is exposed to the former. The projection optical system 1 is telecentric, on its light entrance side and light exit side.

The X-Y-Z stage 4 is movable along an optical axis direction (Z direction) of the reduction projection lens 1 as well as along a plane (X-Y plane) orthogonal to the optical axis direction. It is controlled by a stage driving unit 5. When a circuit pattern is to be transferred to a wafer, light IL is projected from an illumination optical system (not shown) to illuminate a picture field on the reticle 2 where the circuit pattern transfer is to be made.

As shown in FIG. 3, there is a light intensity measuring device 8 adjacent to the wafer 3, having a face substantially at the same level as the top face of the wafer 3. Image plane light intensity distribution data as measured by use of this light intensity measuring device 8 is calculated through a wavefront aberration calculating system 11, by which a wavefront of the projection optical system 1 can be calculated in accordance with a calculation algorithm to be described later.

Next, referring to the projection exposure apparatus of the first embodiment shown in FIG. 3, a method of calculating a wavefront of the projection optical system 1 in accordance with a phase restoration method will be explained. It is to be noted here that, in the following description, a term "state 1" is used to refer to a state (reference state) which provides a reference and a term "state 2" is used to refer to a state wherein the optical characteristic of the projection optical system in the reference state is changed due to an exposure load or any environmental change (such as temperature, pressure or humidity). Measuring the wavefront aberration of the projection optical system in the "state 2" means that the performance of the projection optical system can be detected at an arbitrary moment.

In this embodiment, a light intensity distribution |bm| upon a pupil plane in the state 1 is detected beforehand, in accordance with a conventional phase restoration method, which is based on light intensity distributions on a focal plane and a defocused plane. On the other hand, the image in the state 2, which is produced by illuminating the reticle 2 pattern with the illumination light IL of an exposure wavelength, is imaged upon the light intensity distribution |am| (light intensity upon a focal plane) is measured by the light intensity detecting device 8. By using the pupil plane light intensity distribution |bm| detected beforehand and the light intensity distribution |am| in the state 2 just measured, the wavefront aberration of the projection optical system can be calculated in accordance with the phase restoration method to be described below. The light intensity distribution on the pupil plane is determined by the pattern on the reticle and the effective light source distribution of the illumination optical system. Further, since the effective light intensity distribution of the illumination optical system is controlled so that the intensity distribution is kept constant, it is the same both in the state 1 and in the state 2.

Referring to FIG. 2A, calculation of the wavefront aberration of the reduction projection lens 1 will be explained. First, an arbitrary initial phase is assigned to the image plane light intensity distribution |am| in the state 2. Then, through Fourier transform, a pupil plane complex amplitude distribution in the state 2 is detected. Subsequently, while holding a phase portion of the thus obtained pupil plane complex amplitude distribution in the state 2 as it is, only an absolute value corresponding to an intensity portion thereof is replaced by the pupil plane light intensity distribution |bm| in the state 1, having been already detected, whereby a fresh complex amplitude distribution is determined. Inverse Fourier transform is carried out to the thus determined complex amplitude distribution, by which a complex amplitude distribution upon the focal plane is detected. Again, while holding its phase portion as it is, the intensity thereof is replaced by the image plane light intensity distribution |am| in the state 1. What has been described above concerns a single calculation loop. If, after completion of this loop, a predetermined convergence condition is not satisfied, the procedure for detecting a pupil plane complex amplitude on the basis of Fourier transform is started again.

The above-described calculations are repeated until the convergence, by which the complex amplitude distributions on the focal plane and the pupil plane in the state 2 are calculated. From the complex amplitude on the pupil plane, the wavefront aberration of the reduction projection lens 1 can be calculated. The calculation procedure described above is based on that the pupil plane light intensity distributions in the states 1 and 2 are mutually replaceable, since they correspond to the spectrum of the amplitude distribution on the focal plane.

FIG. 2B is a flow chart showing the procedure of the phase restoration method described above. In an initial loop, an image on the focal plane in the state 2 is measured, and a light intensity distribution |am| is calculated. Since, however, what can be measured is the light intensity distribution only, there is no phase information produced. Subsequently, an initial phase is assigned to the light intensity distribution on the focal plane in the state 2, to produce a complex amplitude. Then, Fourier transform is carried out to transform it into a complex amplitude distribution on the pupil plane in the state 2. Thereafter, the pupil plane light intensity distribution |bm| in the state 1, having been already detected, is read out, and the pupil plane light intensity distribution in the state 2 is replaced by the light intensity distribution in the state 1, while holding the phase term as it is. By this, a fresh complex amplitude distribution is produced. Subsequently, inverse Fourier transform is carried out to this newly produced complex amplitude distribution, to transform the same into a complex amplitude distribution on the image plane in the state 2. If, in the result obtained by the transform, the difference between the image plane light intensity distribution in the state 2 having been measured and the image plane light intensity distribution in the state 2 just calculated through the inverse Fourier transform is not larger than a predetermined value, the calculation loop is completed. If the difference is larger than the predetermined value, the loop is repeated.

In a second loop or loops following it, measurement of the image plane light intensity distribution in the state 2 is not necessary, but the image plane light intensity distribution in the state 2 having been calculated in the initial loop may be read out. The starting phase value for the second loop and loops following it may use the final phase value as calculated in the preceding loop. Thus, in the calculation loop of this embodiment, the pupil plane intensity |bm| in the state 1 (known value) and the image plane intensity |am| in the state 2, are turned back in each of the calculations, and the phase distribution is converged so that the Fourier transform relation between the image plane and the pupil plane is finally matched.

In this embodiment, as described above, it is sufficient to measure the image plane light intensity distribution |am| in the state 2, only once in the initial measurement. Thus, in the procedure for detecting the wavefront aberration of the reduction projection lens 1 in accordance with the phase restoration method, in the present embodiment, only the following two operations are required:

1) Measurement of the image plane light intensity distribution |am| in the state 2; and
2) Amplitude distribution replacement (FFT & iFFT) between the focal plane and the pupil plane.

The light intensity measurement in step 1) above may be performed on the basis of a knife edge method using a photodetector or image measurement using a CCD. The time necessary for the CCD measurement may be one second or less, while the knife edge method may need a measurement time several times longer than the CCD measurement.

The loop for the amplitude distribution replacement in state 2) above usually requires execution of several tens of loops, and a few seconds may be necessary.

Comparing the conventional phase restoration method and that in the present embodiment, with respect to the wavefront aberration calculation time, the results will be as follows.

In the conventional phase restoration method, the following steps are required:

a) Measuring an image plane light intensity distribution |am| on a focal plane;
b) Moving a light intensity detecting device from the focal plane to a defocused plane;
c) Measuring an image plane light intensity distribution |bm| on the defocused plane; and
d) Amplitude distribution replacement (FFT & iFFT) between the focal plane and a pupil plane.

Thus, as compared with the phase restoration method in the present embodiment, there are additional steps b) and c) required.

Step a) takes one second or less. Step b) takes a few seconds. Step c) takes one second or less. Step d) takes a few seconds. Thus, in accordance with the phase restoration method according to this embodiment of the present invention, the time necessary for measurement and calculation of the wavefront of a projection optical system (reduction projection lens) can be reduced to about a half. A considerable increase in speed can be accomplished.

The wavefront aberration of a projection optical system varies subtly in a short time, due to an exposure load or an environmental change (e.g., temperature, pressure or humidity), and there may occur a difference between before and after the wavefront aberration measurement. For this reason, shortening the measurement time to reduce the influence of the variation and accurately detecting the performance of the projection optical system at an arbitrary moment as a function of time, are very important for a projection exposure apparatus. In accordance with the phase restoration method used in this embodiment, only a single measurement is necessary, which effectively leads to miniaturization of the measurement time. Thus, the wavefront aberration can be measured very precisely.

As described above, by memorizing a pupil plane light intensity distribution of a projection optical system in a reference state beforehand, a wavefront aberration of the projection optical system in a state, changed from the reference state, can be detected through only a single image measurement operation (a smallest operation time). Therefore, the wavefront aberration of a projection optical system, which is variable even in a short time due to the environment, can be calculated very quickly and very precisely. This largely contributes to improvements in performance of a projection exposure apparatus.

While the invention has been described with reference to the structures disclosed herein, it is not confined to the details set forth and this application is not intended to cover such modifications or changes as may come within the purposes of the improvements or the scope of the following claims.

What is claimed is:

1. A method of measuring a wavefront aberration of a predetermined optical system being serviceable for imaging a pattern, said method comprising the steps of:

storing information related to a light intensity distribution on a pupil plane of the predetermined optical system in a reference state; and detecting a wavefront of the predetermined optical system in an arbitrary state, on the basis of the stored information.

2. A method according to claim 1, wherein said detecting step includes performing a calculation based on a value obtained by a measurement of a light intensity distribution of the predetermined optical system upon the pupil plane, in the arbitrary state, and on the stored information.

3. A method according to claim 2, wherein the calculation is performed by use of a phase restoration method.

4. A method according to claim 3, wherein the information related to the pupil plane light intensity distribution in the reference state is detectable by use of a phase restoration method.

5. A method according to claim 4, wherein, each time a wavefront aberration of the predetermined optical system is measured by use of a phase restoration method, the stored information is used as an absolute value of an amplitude distribution on the pupil plane while a measured value of a light intensity distribution on an image plane of the predetermined optical system in the arbitrary state is used as an absolute value of an amplitude distribution on the image plane.

6. A method of measuring a wavefront of an optical system having a focal plane and a pupil plane placed in a Fourier-to-inverse Fourier relation, said method comprising the steps of:

storing information related to a light intensity distribution on a pupil plane of the optical system in a reference state; and detecting a wavefront of the optical system in an arbitrary state, on the basis of the stored information.

7. A method according to claim 6, wherein said detecting step includes performing a calculation based on a value obtained by measurement of a light intensity distribution of the optical system upon the pupil plane, in the arbitrary state, and on the stored information.

8. A method according to claim 7, wherein the calculation is performed by use of a phase restoration method.

9. A method according to claim 8, wherein the information related to the pupil plane light intensity distribution in the reference state is detectable by use of a phase restoration method.

10. A method according to claim 9, wherein, each time a wavefront aberration of the optical system is measured by use of a phase restoration method, the stored information is used as an absolute value of an amplitude distribution on the pupil plane while a measured value of a light intensity distribution on an image plane of the optical system in the arbitrary state is used as an absolute value of an amplitude distribution on the image plane.

11. A method of measuring a wavefront of an optical system, said method comprising the steps of:

measuring a light intensity distribution on an image plane of the optical system; and calculating a state of the wavefront of the optical system on the basis of the measured light intensity distribution and of a light intensity distribution on a pupil plane of the optical system stored beforehand.

* * * * *